(12) United States Patent
Kim et al.

(10) Patent No.: US 7,787,059 B2
(45) Date of Patent: Aug. 31, 2010

(54) DIGITAL TELEVISION RECEIVER

(75) Inventors: Beom-Kon Kim, Suwon-si (KR);
Zhidkov Sergey, Suwon-si (KR)

(73) Assignee: Samsung Electronics Co., Ltd.,
Suwon-Si (KR)

( * ) Notice: Subject to any disclaimer, the term of this patent is extended or adjusted under 35 U.S.C. 154(b) by 1027 days.

(21) Appl. No.: 11/436,217

(22) Filed: May 18, 2006

(65) Prior Publication Data

US 2007/0268408 A1   Nov. 22, 2007

(51) Int. Cl.
*H04N 5/54*   (2006.01)
(52) U.S. Cl. .................................................... 348/725
(58) Field of Classification Search ................ 348/725, 348/726, 552–554, 731–733, 607; 725/151, 725/131; 375/148, 152
See application file for complete search history.

(56) References Cited

U.S. PATENT DOCUMENTS

| | | | | |
|---|---|---|---|---|
| 5,357,284 A * | 10/1994 | Todd | | 348/486 |
| 5,539,770 A * | 7/1996 | Ishigaki | | 375/141 |
| 5,737,035 A * | 4/1998 | Rotzoll | | 348/725 |
| 6,009,317 A * | 12/1999 | Wynn | | 455/296 |
| 6,133,871 A * | 10/2000 | Krasner | | 342/357.06 |
| 7,038,730 B2 * | 5/2006 | Markman et al. | | 348/607 |
| 7,394,500 B2 * | 7/2008 | Zhu et al. | | 348/554 |
| 7,430,257 B1 * | 9/2008 | Shattil | | 375/347 |
| 7,440,490 B2 * | 10/2008 | Kidiyarova-Shevchenko et al. | | 375/148 |
| 7,505,086 B2 * | 3/2009 | Yun et al. | | 348/725 |
| 7,542,100 B2 * | 6/2009 | Yee et al. | | 348/726 |
| 7,548,281 B2 * | 6/2009 | Kim et al. | | 348/726 |
| 7,602,444 B2 * | 10/2009 | Cheon et al. | | 348/500 |

FOREIGN PATENT DOCUMENTS

| | | |
|---|---|---|
| JP | 2003-318761 | 11/2003 |
| KR | 1020040006449 | 1/2004 |
| KR | 1020050076882 A | 7/2005 |

* cited by examiner

*Primary Examiner*—Paulos M Natnael
(74) *Attorney, Agent, or Firm*—F. Chau & Associates, LLC (57) ABSTRACT

A ATSC compliant digital television (DTV) receiver including an image rejection filter, an interpolator, a numerically controlled oscillator (NCO), a matched filter unit, a frequency converter, and a DC remover. The image rejection filter removes (filters out) an unwanted image signal and an adjacent channel's interference signal from a first intermediate frequency (IF) signal sampled at a first sampling frequency. The interpolator resamples (at a second sampling frequency) a signal output from the image rejection filter and compensates for a predetermined symbol timing offset in response to a first control signal, thereby outputting a second IF signal. The NCO down converts the second IF signal and simultaneously compensates for a predetermined carrier offset in response to a second control signal, thereby outputting a first complex signal. The matched filter unit receives the first complex signal and filters the first complex signal, thereby outputting a second complex signal. The frequency converter generates a third complex signal having a double side band from the second complex signal output from the matched filter unit. The DC remover removes (filters out) a pilot signal from a DC signal included in the third complex signal output from the frequency converter.

22 Claims, 5 Drawing Sheets

DIGITAL TELEVISION RECEIVER

BACKGROUND OF THE INVENTION

1. Field of the Invention

The present invention relates to a digital receiver, and more particularly, to an Advanced Television Systems Committee (ATSC) digital television (DTV) receiver including a digital surface acoustic wave (SAW) filter and/or a digital gain control circuit to remove the influence of an adjacent-channel's interference signal.

2. Description of the Related Art

An ATSC receiver is a digital television (DTV) receiver that can receive signals transmitted according to the ATSC DTV standard A/53, detailed information about which can currently be obtained at http://www.atsc.org. This standard is approved by the Federal Communications Commission (FCC) for use in terrestrial broadcasting in the United States of America. Advanced Television Systems Committee (ATSC) digital television (DTV) broadcast signals have been transmitted by many television stations in the United States and Korea. However, since National Television Standards Committee (NTSC) broadcast signals are still used together with ATSC DTV broadcast signals, ATSC receivers need to have excellent performance despite an environment of interfering DTV broadcast signals.

A Digital Television Standard published by the Advanced Television Systems Committee (ATSC) specifies vestigial sideband (VSB) signals for transmitting digital television (DTV) signals within the same 6-MHz-bandwidth television channels that are currently used in over-the-air broadcasting of National Television System Committee (NTSC) analog television signals within the United States. The VSB DTV signal is designed so its spectrum interleaves with the spectrum of a co-channel interfering NTSC analog TV signals. This is done by positioning the pilot carrier and the principal amplitude-modulation sideband frequencies of the DTV signal at odd multiples of one-quarter the horizontal scan line rate of the NTSC analog TV signal that fall between the even multiples of one-quarter the horizontal scan line rate of the NTSC analog TV signal, at which even multiples most of the energy of the luminance and chrominance components of a co-channel interfering NTSC analog TV signal will fall. The video carrier of an NTSC analog TV signal is offset 1.25 MHz from the lower limit frequency of the television channel. The carrier of the DTV signal is offset from such video carrier by 59.75 times the horizontal scan line rate of the NTSC analog TV signal, to place the carrier of the DTV signal about 309,877.6 Hz from the lower limit frequency of the television channel. Accordingly, the carrier of the DTV signal is about 2,690122.4 Hz from the middle frequency of the television channel. The exact symbol rate in the Digital Television Standard is (684/286) times the 4.5 MHz sound carrier offset from video carrier in an NTSC analog TV signal. The number of symbols per horizontal scan line in an NTSC analog TV signal is 684, and 286 is the factor by which horizontal scan line rate in an NTSC analog TV signal is multiplied to obtain the 4.5 MHz sound carrier offset from video carrier in an NTSC analog TV signal. The symbol rate is $10.762238*10^6$ symbols per second, which can be contained in a VSB signal extending 5.381119 MHz from DTV signal carrier. That is, the VSB signal can be limited to a band extending 5.690997 MHz from the lower limit frequency of the television channel.

The ATSC standard for digital HDTV signal terrestrial broadcasting in the United States of America is capable of transmitting either of two high-definition television (HDTV) formats with 16:9 aspect ratio. One HDTV format uses 1920 samples per scan line and 1080 active horizontal scan lines per 30 Hz frame with 2:1 field interlace. The other HDTV format uses 1280 luminance samples per scan line and 720 progressively scanned scan lines of television image per 60 Hz frame. The ATSC standard also accommodates the transmission of DTV formats other than HDTV formats, such as the parallel transmission of four television signals having normal definition in comparison to an NTSC analog television signal.

In a location where two or more digital TV stations influence (interfere with) each other, the magnitude of an adjacent signal of an unwanted channel may be greater than that of a signal of a wanted channel. Wireless DTV transmissions environments typically have a larger dynamic range (range of signal magnitude) than cable transmission environments. When a ratio of the magnitude of a signal of an unwanted channel to the magnitude of a signal of a wanted channel increases, it may be difficult or impossible for a user to reliably receive the signal of the wanted channel depending upon the performance of the tuner and/or receiver. Accordingly, an ATSC DTV receiver capable of removing an adjacent channel's interference signal (removing adjacent-channel interference) is desired to increase receiving performance.

In DTV receivers and similar receiver apparatus for receiving a carrier amplitude-modulated by multi-level symbol code sequences, demodulation has been done in the analog regime to reproduce the multi-level symbol code sequences at baseband, with the demodulation results subsequently being digitized. ATSC DTV receivers can be constructed in which an intermediate-frequency (IF) amplitude-modulation (AM) signal developed by down-conversion of a received radio-frequency (RF) AM signal is demodulated by synchrodyning in a mixer. It is preferable that the IF signal be supplied as a complex signal having real (Q) and imaginary (I) portions.

The amplitude and phase mismatches between the receiver I and Q signal branches may result in imperfect attenuation of the image signal band. The task of improving the image signal attenuation of the basic quadrature downconversion scheme, either using analog or digital techniques, has been addressed to some extent by conventional real image rejection filtering.

Figure 1:
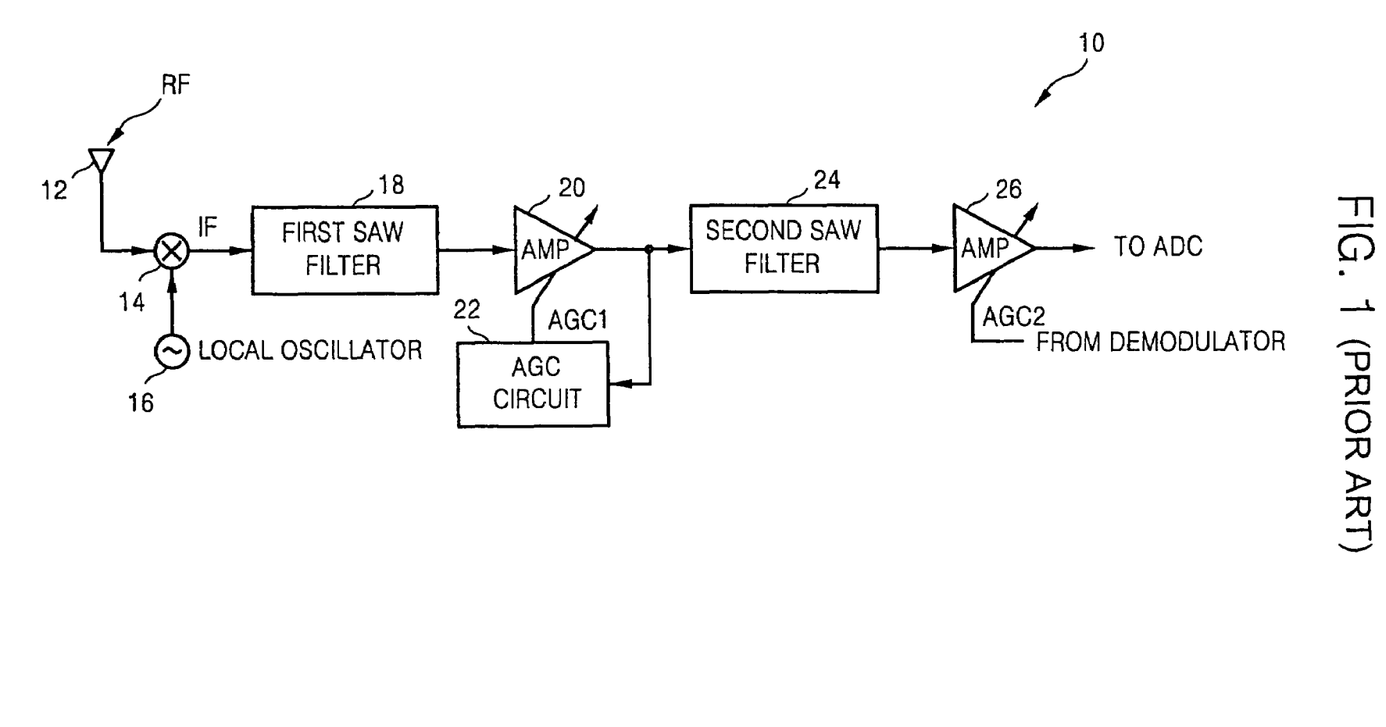
FIG. 1 is a functional block diagram of a tuner having a conventional dual (two) surface acoustic wave (SAW) filter structure.

FIG. 1 is a functional block diagram of a tuner 10 having a typical dual (two) SAW (surface acoustic wave) filter structure. Referring to FIG. 1, a mixer 14 functioning as a down converter receives a radio frequency (RF) signal (received via an antenna 12) and a signal output from a local oscillator 16, and outputs an intermediate frequency (IF) signal having a center frequency of 44 MHz based on the radio frequency (RF) and the signal output from a local oscillator 16.

A first SAW filter 18 removes (filters out) an image signal and an adjacent interference signal from the IF signal output from the mixer 14. Generally, the bandwidth of the first SAW filter 18 is greater than 6 MHz. The first SAW filter 18 tends to attenuate the signal passing through it.

A first variable amplifier (AMP) 20 adjusts the gain of the signal attenuated by the first SAW filter 18 based on an automatic gain control signal AGC1 output from an automatic gain control (AGC) circuit 22. The AGC circuit 22 generates the automatic gain control signal AGC1 based on an output signal of the first AMP 20.

A second SAW filter 24 removes (filters out) an image signal and an adjacent interference signal from the output signal of the first variable amplifier 20. The bandwidth of the second SAW filter 24 is less than that of the first SAW filter 18. A second variable amplifier 26 adjusts the gain of a signal attenuated by the second SAW filter 24 based on an automatic gain control signal AGC2 output from a demodulator (not shown). An output signal of the second variable amplifier 26 is output to an analog-to-digital (ADC) (not shown). The tuner 10 may be implemented on a single chip.

Figure 2:
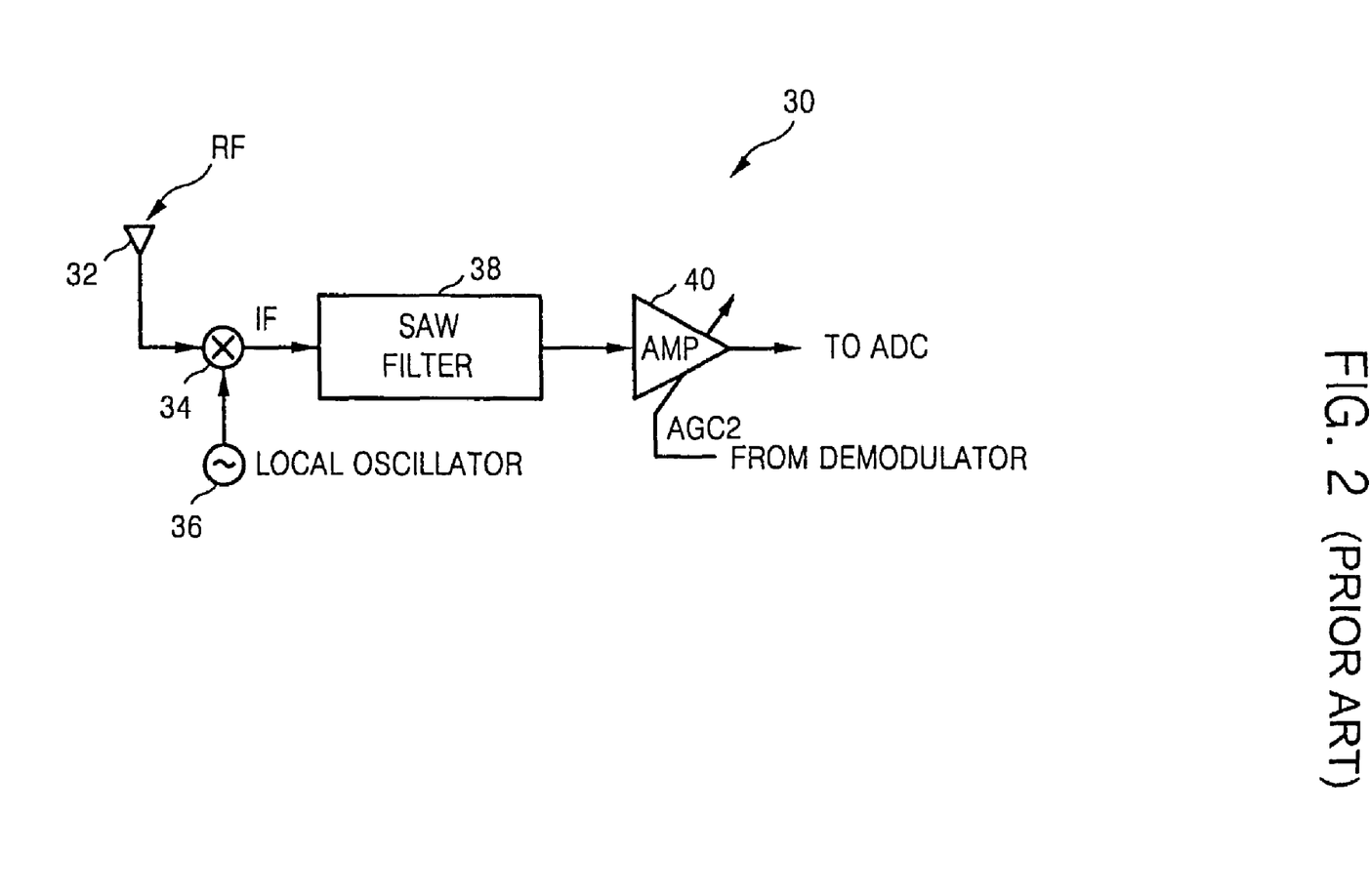
FIG. 2 is a functional block diagram of a tuner having a conventional single (one) surface acoustic wave (SAW) filter structure.

FIG. 2 is a functional block diagram of a tuner 30 having a single (one) SAW (surface acoustic wave) filter structure. Referring to FIG. 2, a mixer 34 outputs an IF signal having a center frequency of 44 MHz based on an RF signal received through an antenna 32 and upon a signal output from a local oscillator 36. A SAW filter 38 removes (filters out) an image signal and an adjacent interference signal from the IF signal output from the mixer 34. The SAW filter 38 attenuates the signal it receives and filters. An variable amplifier 40 adjusts the gain of the signal attenuated by the SAW filter 38 based on an automatic gain control signal AGC2 output from a demodulator (not shown).

When necessary, the tuner 30 may further include the first variable amplifier 20 and/or the AGC circuit 22 illustrated in FIG. 1. When the single SAW filter 38 is used as illustrated in FIG. 2, the structure of the tuner 30 is simplified and development cost is reduced.

SUMMARY OF THE INVENTION

A band-pass (e.g., SAW filter) is used for rejecting the unwanted image frequencies that accompany the downconversion result supplied from the mixer. The SAW filter has flat amplitude response over a bandwidth of at least 6 MHz. The SAW filter has linear phase response over that bandwidth or, alternatively, its phase response is modified for optimizing overall phase response for the DTV receiver up to the point that synchrodyning to baseband is completed.

The present invention provides a ATSC digital television (DTV) receiver capable of removing the influence of an adjacent channel's interfering signal, and of reliably receiving the signal of channel despite adjacent-channel interference.

According to an aspect of the present invention, there is provided a digital television receiver including an image rejection filter removing an image signal and an adjacent interference signal from a first intermediate frequency (IF) signal sampled at a first sampling frequency; an interpolator resampling a signal output from the image rejection filter at a second sampling frequency and simultaneously compensating for a predetermined symbol timing offset in response to a first control signal, thereby outputting a second IF signal; a first frequency converter down converting the second IF signal and simultaneously compensating for a predetermined carrier offset in response to a second control signal, thereby outputting a first complex signal; a matched filter unit receiving the first complex signal and filtering the first complex signal, thereby outputting a second complex signal; a second frequency converter generating a third complex signal having a double side band from the second complex signal output from the matched filter unit; and a DC remover removing a pilot signal from a DC signal included in the third complex signal output from the second frequency converter.

The image rejection filter may be a band pass digital surface acoustic wave (SAW) filter. The bandwidth of the band pass digital SAW filter may be 5.38 MHz+α where α may be a real number corresponding to the predetermined carrier offset.

The matched filter unit may include a first matched filter filtering a real signal included in the first complex signal and a second matched filter filtering an imaginary signal included in the first complex signal. Each of the first matched filter and the second matched filter may be a root raised-cosign type matched filter having a roll-off factor of 0.1152.

The digital television receiver may further include a symbol timing recovery circuit estimating the predetermined symbol timing offset in response to the third complex signal and generating the first control signal based on a result of the estimation.

The digital television receiver may further include a carrier recovery circuit estimating the predetermined carrier offset in response to the third complex signal and generating the second control signal based on a result of the estimation.

The digital television receiver may further include a first variable amplifier controlling the gain of a real signal included in a complex signal, output from the DC remover, in response to a third control signal; a second amplifier controlling the gain of an imaginary signal included in the complex signal, output from the DC remover, in response to the third control signal; and a digital automatic gain control circuit generating the third control signal based on a real signal output from the first amplifier and an imaginary signal output from the second amplifier.

The digital automatic gain control circuit may include a first magnitude calculation circuit calculating a magnitude of the real signal output from the first amplifier; a second magnitude calculation circuit calculating a magnitude of the imaginary signal output from the second amplifier; a first adder summing an output signal of the first magnitude calculation circuit and an output signal of the second magnitude calculation circuit; a subtractor detecting a difference between an output signal of the first adder and a reference signal; a first amplifier having a first step size, receiving a signal output from the subtractor, and controlling a convergence speed of the received signal; an accumulator detecting gain information based on a signal output from the first amplifier; a second adder summing a signal output from the accumulator and a predetermined gain; and a first delay circuit delaying an output signal of the second adder by a first delay time, thereby outputting the third control signal.

According to another aspect of the present invention, there is provided a digital television receiver including an interpolator resampling a first intermediate frequency (IF) signal, sampled at a first sampling frequency, at a second sampling frequency and simultaneously compensating for a predetermined symbol timing offset in response to a first control signal, thereby outputting a second IF signal; a first frequency converter down converting the second IF signal and simultaneously compensating for a predetermined carrier offset in response to a second control signal, thereby outputting a first complex signal; a filter receiving the first complex signal and removing an image signal and an adjacent interference signal from the first complex signal, thereby outputting a second complex signal; a second frequency converter generating a third complex signal having a double side band from the second complex signal output from the filter; and a DC remover removing a pilot signal from a DC signal included in the third complex signal output from the second frequency converter.

The filter may include a first filter removing the image signal and the adjacent interference signal from a real signal included in the first complex signal, a first matched filter filtering a signal output from the first filter, a second filter removing the image signal and the adjacent interference signal from an imaginary signal included in the first complex signal, and a second matched filter filtering a signal output from the second filter.

Each of the first filter and the second filter may be a low pass digital surface acoustic wave (SAW) filter. The bandwidth of the low pass digital SAW filter may be 5.38 MHz. Alternatively, each of the first filter and the second filter may be a finite impulse response filter.

The attached drawings illustrating preferred embodiments of the present invention are provided in order to convey to persons skilled in the art a sufficient understanding of the present invention.

Hereinafter, the present invention will be described in detail by explaining preferred embodiments of the invention with reference to the attached drawings. Like reference numerals in the drawings denote like elements.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF EXEMPLARY EMBODIMENTS OF THE INVENTION

Figure 3:
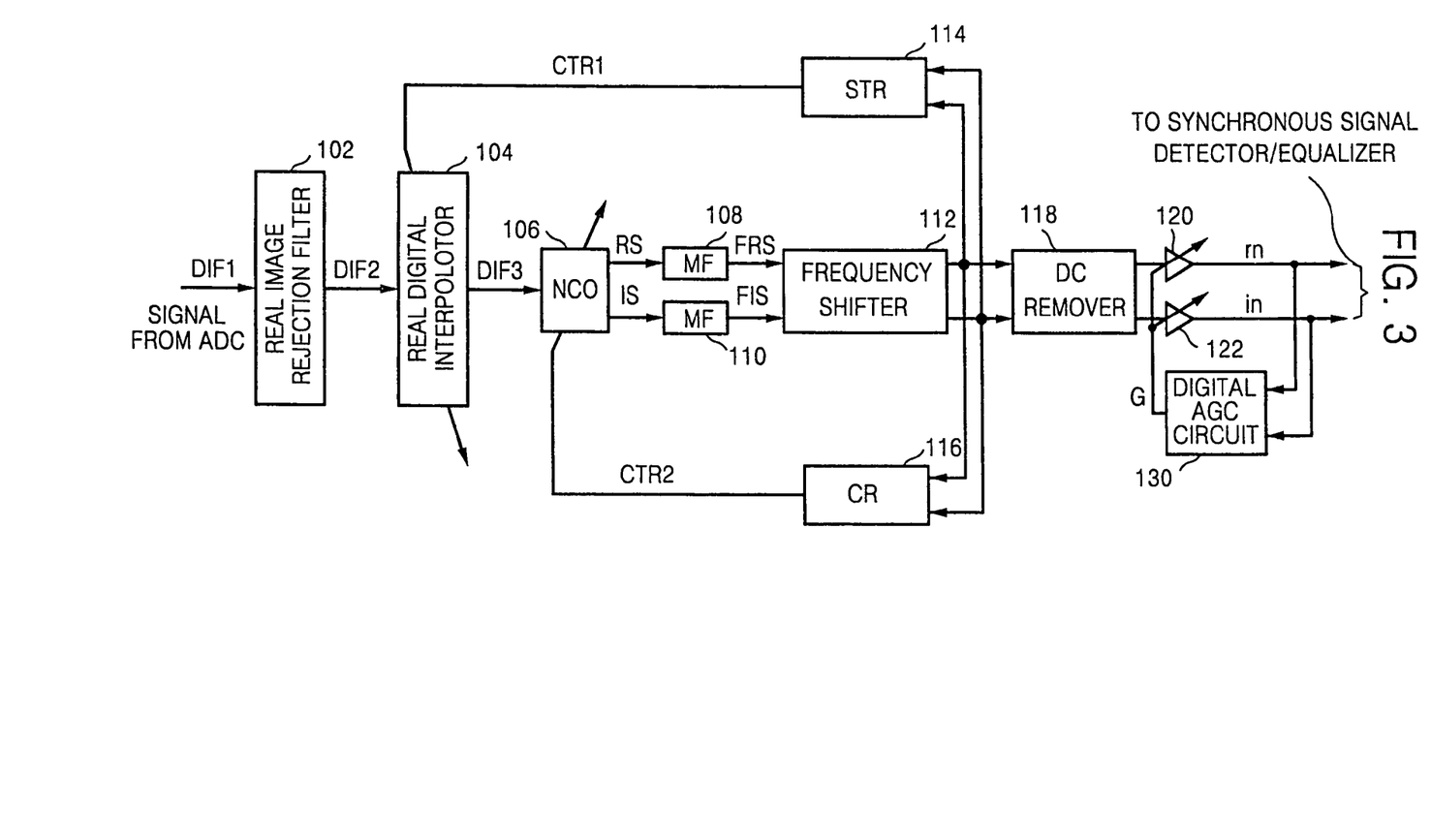
FIG. 3 is a functional block diagram of an Advanced Television Systems Committee (ATSC) compliant digital television (DTV) receiver including a digital SAW filter and a digital automatic gain control (AGC) circuit, according to an embodiment of the present invention.

FIG. 3 is a functional block diagram of an Advanced Television Systems Committee (ATSC) Digital Television (DTV) receiver 100 including a digital SAW filter and a digital automatic gain control (AGC) circuit, according to an embodiment of the present invention.

Referring to FIG. 3, the ATSC receiver 100 includes a real image rejection filter 102, a real digital interpolator 104, a numerically controlled oscillator (NCO) 106, a first matched filter (MF) 108, a second matched filter (MF) 110, a frequency shifter 112, a symbol timing recovery (STR) circuit 114, a carrier recovery (CR) circuit 116, and a DC remover 118. The ATSC receiver 100 may further include a first variable amplifier (AMP) (or a first multiplier) 120, a second variable amplifier (AMP) (or a second multiplier) 122, and a digital automatic gain control (AGC) circuit 130.

The real image rejection filter (or image rejection filter) 102 receives a first IF signal DIF1, which has been digitized (e.g., sampled at a first frequency by an analog-to-digital converter (ADC)), and removes (filters out) an image signal and/or an adjacent interference signal from the first IF signal DIF1, and outputs a second (filtered) IF signal DIF2. The first (sampling) frequency may be 24.69 MHz but is not restricted thereto.

The real image rejection filter 102 is a digital SAW filter and may be implemented as a band pass filter. The bandwidth of the real image rejection filter 102 should be 5.38 MHz+α where "α" is a real number and is determined considering the tracking range for a carrier offset (or carrier frequency offset).

The real digital interpolator (or digital interpolator) 104 receives the second (digital) IF signal DIF2 having the first (sample) frequency, output from the real image rejection filter 102, and outputs a third (digital) IF signal DIF3 having a second (sample) frequency. The second frequency may be 21.52 MHz but is not restricted thereto.

In other words, the real digital interpolator 104 resamples the second IF signal DIF2, which has been sampled at a first sampling period (time-interval) $T_{S1}$ (e.g., $$T_{S2} = \frac{T}{2} = \frac{1}{21.52\,\text{MHz}})$$

at a second sampling period $T_{S2}$ (e.g., $$T_{S1} = \frac{1}{24.69\,\text{MHz}}),$$

and simultaneously compensates for a predetermined symbol timing offset estimated by the symbol timing recovery (STR) circuit (or symbol timing synchronization loop) 114 in response to a first control signal CTR1, thereby outputting the third (digital) IF signal DIF3.

The NCO 106 shifts the third IF signal DIF3 output from the real digital interpolator 104 to a "zeroth frequency" and simultaneously compensates for a predetermined carrier offset estimated by the CR circuit 116 in response to a second control signal CTR2, thereby outputting a complex signal. Accordingly, the NCO 106 functions as a down frequency converter (downconverter) and outputs a complex signal.

The first matched filter MF 108 filters a real signal RS in the complex signal output from the NCO 106 and outputs a filtered real signal FRS. The second matched filter MF 110 filters an imaginary signal IS in the complex signal output from the NCO 106 and outputs a filtered imaginary signal FIS. Each of the first matched filter MF 108 and the second matched filter MF 110 may be implemented by a root raised-cosign type matched filter MF having a roll-off factor of 0.1152.

The frequency shifter 112 receives the filtered real signal FRS having the "zeroeth frequency" from the first matched filter MF 108 and the filtered imaginary signal FIS having the "zero frequency" from the second matched filter MF 110 and shifts the filtered real signal FRS and the filtered imaginary signal FIS to ±fc (where fc is a frequency of, for example, 2.69 MHz). Accordingly, a vestigial side band (VSB) signal according to an ATSC transmission standard is converted into a double side band (DSB) signal by the frequency shifter 112.

The symbol timing recovery (STR) circuit 114 estimates a predetermined symbol timing offset and controls the sampling period of the real digital interpolator 104 based on the complex signal output from the frequency shifter 112. The symbol timing recovery (STR) circuit 114 outputs the first control signal CTR1 for controlling the sampling period of the real digital interpolator 104. Accordingly, the real digital interpolator 104 compensates for the predetermined symbol timing offset estimated by the STR circuit 114 in response to the first control signal CTR1.

The carrier recovery CR circuit 116 estimates the carrier offset based on the complex signals output from the frequency shifter 112 and outputs the second control signal CTR2 for compensating for a carrier offset of the NCO 106 to the NCO 106. The NCO 106 compensates for the carrier offset estimated by the CR circuit 116 in response to the second control signal CTR2.

The DC remover 118 removes (filters out) a pilot signal (a DC signal included in the complex signal output from the frequency shifter 112) and outputs the filtered complex signal from which a pilot signal has been removed.

The first variable amplifier 120 controls the gain of a real signal in the filtered complex signal output from the DC remover 118 in response to a third control signal G output from the digital AGC circuit 130 and outputs the gain-controlled real signal $r_n$ to a synchronous signal detector (not shown) or an equalizer (not shown).

The second variable amplifier 122 controls the gain of an imaginary signal in the filtered complex signal output from the DC remover 118 in response to the third control signal G output from the digital AGC circuit 130 and outputs the gain-controlled imaginary signal $i_n$ to the synchronous signal detector (not shown) or the equalizer (not shown).

Figure 4:
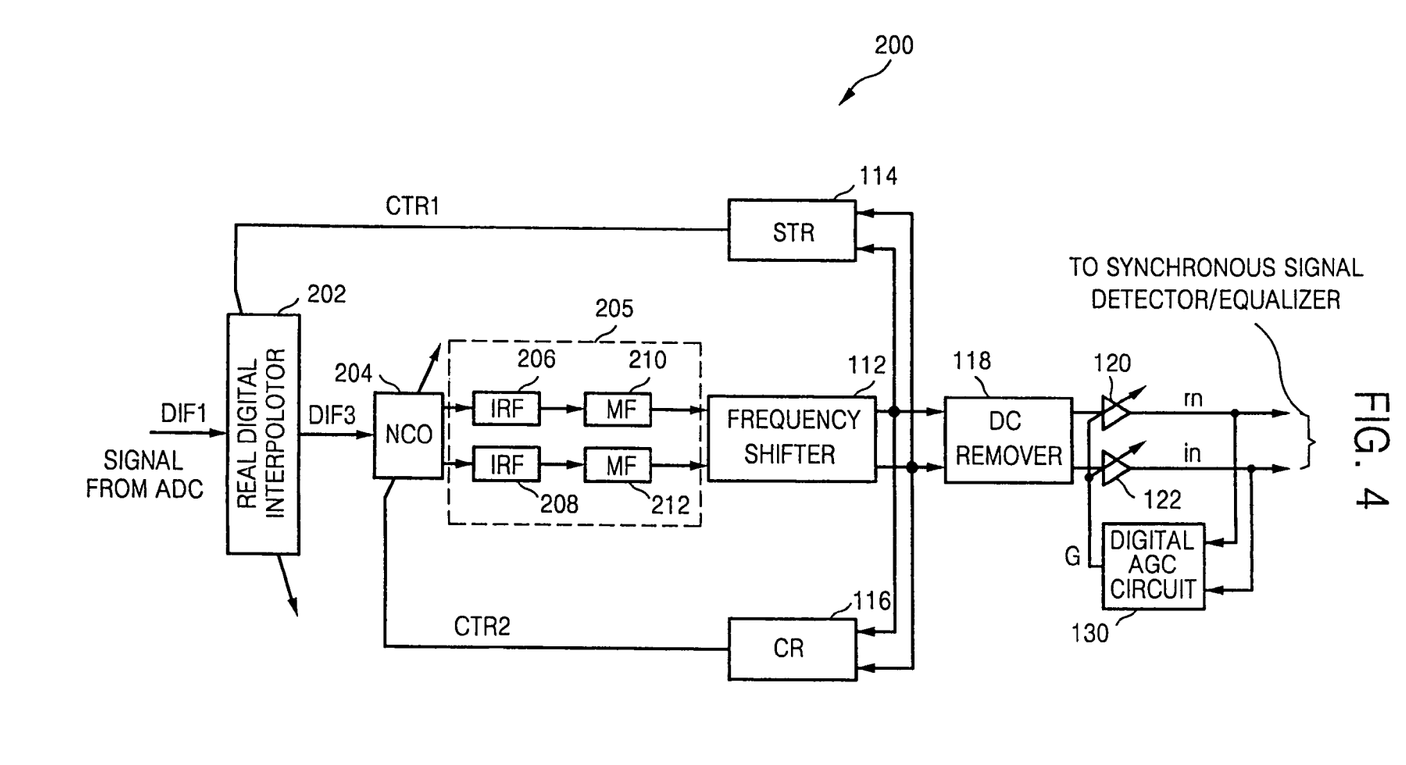
FIG. 4 is a functional block diagram of an ATSC compliant Digital Television (DTV) receiver including a digital SAW filter and a digital AGC circuit, according to another embodiment of the present invention.
Figure 5:
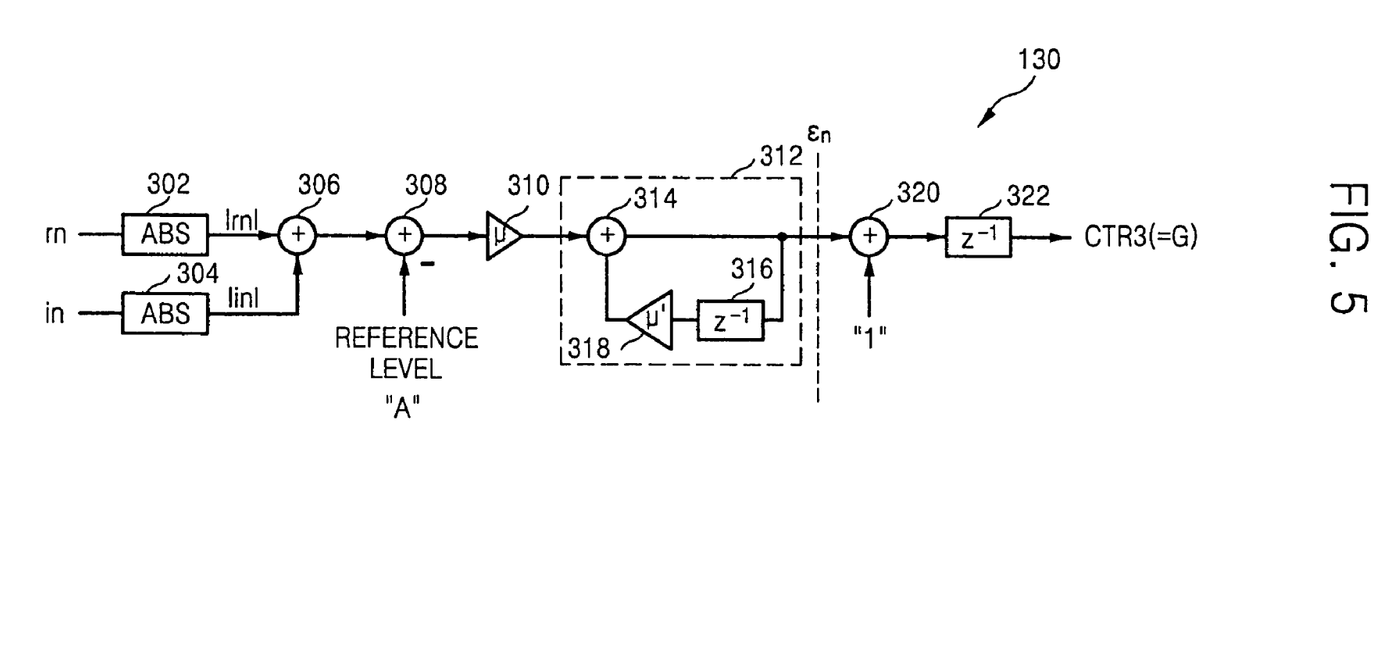
FIG. 5 is a functional block diagram of the digital AGC circuit in the receivers of FIGS. 3 and 4.

FIG. 5 is a functional block diagram of the digital automatic gain control (AGC) circuit 130 in the receiver of FIGS. 3 and 4. Referring to FIG. 5, the digital automatic gain control (AGC) circuit 130 includes a first magnitude calculation circuit (or a first absolute value calculation circuit) ABS 302, a second magnitude calculation circuit (or a second absolute value calculation circuit) 304, a first adder 306, a subtractor 308, a first amplifier 310, an accumulator 312, a second adder 320, and a first delay circuit 322.

The first magnitude calculation circuit ABS 302 receives the real signal $r_n$, calculates the magnitude (or absolute value) of the real signal $r_n$, and outputs the calculated magnitude (or calculated absolute value) $|r_n|$. The second magnitude calculation circuit ABS 304 receives the imaginary signal $i_n$, calculates the magnitude (or absolute value) of the imaginary signal $i_n$, and outputs the calculated magnitude (or calculated absolute value) $|i_n|$. Instead of the magnitude calculation circuits 302 and 304, power calculators may be used where power calculators have the same effects as the magnitude calculation circuits 302 and 304.

The first adder 306 sums the magnitudes (absolute values) of the real signal $r_n$, (i.e., $|r_n|$) calculated by adding together the first magnitude calculation circuit ABS 302 and the magnitude of the imaginary signal $i_n$, (i.e., $|i_n|$) calculated by the second magnitude calculation circuit 304.

The subtractor 308 (depicted as an adder with an inverted, –, input) subtracts a reference level "A" from a signal output from the first adder 306 and outputs the result of the subtraction to the first amplifier AMP 310. The subtractor 308 may be replaced by an adder.

The first amplifier 310 has a gain for controlling a convergence speed, i.e., a step size "μ".

The accumulator 312 detects gain information based on a signal output from the first amplifier 310. The accumulator 312 includes a third adder 314, a second delay circuit 316, and a second amplifier 318. The third adder 314 sums the signal output from the first amplifier 310 and a signal output from the second amplifier 318 and outputs the addition result. The second amplifier 318 has a gain of step size "μ'". Each of the gains (step sizes) "μ" and "μ'" is a real number. The second delay circuit 316 delays an output signal of the third adder 314 by a predetermined time. The second amplifier 318 amplifies a signal output from the second delay circuit 316.

The second adder 320 adds "1" to the output signal of the third adder 314 and outputs the addition result to the first delay circuit 322. The first delay circuit 322 delays an output signal of the second adder 320 by a predetermined time (e.g., a 1-tap), thereby outputting the third control signal CTR3 (=G). Accordingly, the digital AGC circuit 130 has a 1-tap delay feedback structure.

Here, a magnitude G of the third control signal CTR3 is defined as in Equation (1):

Equation 1

$$G = \mu \sum_{n=-\infty}^{\infty} [|r_n| - \mu'|r_{n-1}| + |i_n| - \mu'|i_{n-1}| - A(1 - \mu')] + 1 \quad (1)$$

where "μ" and "μ'" denote step sizes, $r_n$ is a real signal, $i_n$ is an imaginary signal, A is a reference signal, μ'>μ, $r_{n-1}$ is a real signal output from the second delay circuit 316, and $i_{n-1}$ is an imaginary signal output from the second delay circuit 316.

FIG. 4 is a functional block diagram of an ATSC compliant Digital Television (DTV) receiver 200 including a digital SAW filter and a digital AGC circuit, according to another embodiment of the present invention. Hereinafter, the operation of the ATSC DTV receiver 200 will be described with reference to FIGS. 4 and 5.

The ATSC receiver 200 includes a real digital interpolator 202, an numerically controlled oscillator (NCO) 204, a complex signal filter unit 205, the frequency shifter 112, the symbol timing recovery (STR) circuit 114, the carrier recovery (CR) circuit 116, and the DC remover 118. The ATSC DTV receiver 200 may further include the first amplifier 120, the second amplifier 122, and the digital AGC circuit 130.

The real digital interpolator (or digital interpolator) 202 receives an IF signal DIF1 sampled at the first frequency by an ADC (not shown) and outputs an IF signal DIF3 having the second frequency. The second frequency may be 21.52 MHz but is not restricted thereto.

In other words, the real digital interpolator 202 resamples the IF signal DIF1, which has been sampled at a first sampling period $T_{S1}$ (e.g., $$T_{S1} = \frac{1}{24.69\,\text{MHz}}),$$

at a second sampling period $T_{S2}$ (e.g., $$T_{S2} = \frac{T}{2} = \frac{1}{21.52\,\text{MHz}})$$

and simultaneously compensates for an symbol timing offset estimated by the STR circuit 114 in response to the first control signal CTR1, thereby outputting the IF signal DIF3.

The NCO 204 shifts the IF signal DIF3 output from the real digital interpolator 202 to a "zeroeth frequency" and simultaneously compensates for a carrier offset estimated by the CR circuit 116 in response to the second control signal CTR2, thereby outputting a complex signal.

The complex signal filter unit 205, as a digital SAW filter, removes (filters out) an image signal and/or an adjacent interference signal from the complex signal output from the NCO 204 and outputs the filtered complex signal to the frequency shifter 112. The complex signal filter unit 205 includes a first image rejection filter (IRF) 206, a second image rejection filter (IRF) 208, a first matched filter MF 210, and a second matched filter MF 212.

The first image rejection filter (IRF) 206 removes (filters out) the image signal and/or the adjacent interference signal from a real signal in the complex signal output from the NCO 204 and outputs the filtered real signal to the first matched filter MF 210. The second image rejection filter (IRF) 208 removes (filters out) the image signal and/or the adjacent interference signal from an imaginary signal in the complex signal output from the NCO 204 and outputs the filtered imaginary signal to the second matched filter MF 212.

At least one of the first image rejection filter (IRF) 206 and the second image rejection filter (IRF) 208 may be implemented by a low pass filter. The bandwidth of each of the filters 206 and 208 may be 5.38 MHz but is not restricted thereto. Alternatively, at least one of the first image rejection filter (IRF) 206 and the second image rejection filter (IRF) 208 may be implemented by a finite impulse response (FIR) filter, which may have at least 32 taps.

The first matched filter MF 210 filters a signal output from the first image rejection filter (IRF) 206 and outputs a filtered real signal. The second matched filter MF 212 filters a signal output from the second image rejection filter (IRF) 208 and outputs a filtered imaginary signal. Each of the first matched filter MF 210 and the second matched filter MF 212 is a root raised-cosign type matched filter MF having a roll-off factor of 0.1152.

As described above, the present invention effectively removes (filters out) an adjacent-channel interference signal.

What is claimed is:

1. A digital television receiver comprising:
   an image rejection filter configured to remove an image signal and an adjacent interference signal from a first intermediate frequency (IF) signal sampled at a first sampling frequency;
   an interpolator configured to generate a second IF signal by resampling the signal output from the image rejection filter at a second sampling frequency and compensating for a predetermined symbol timing offset in response to a first control signal;
   a first frequency converter configured to generate a first complex signal by down convert the second IF signal and compensating for a predetermined carrier offset in response to a second control signal;
   a matched filter unit configured to generate a second complex signal by receiving the first complex signal and filtering the first complex signal;
   a second frequency converter configured to generate a third complex signal having a double side band characteristic using the second complex signal output by the matched filter unit; and
   a DC remover configured to remove a pilot signal from a DC signal included within the third complex signal output by the second frequency converter.

2. The digital television receiver of claim 1, wherein the image rejection filter includes a band pass digital surface acoustic wave (SAW) filter.

3. The digital television receiver of claim 2, wherein the bandwidth of the band pass digital SAW filter is 5.38 MHz+α, where α is a real number corresponding to the predetermined carrier offset.

4. The digital television receiver of claim 1, wherein the first frequency converter includes a numerically controlled oscillator configured to convert the second IF signal resampled at the second frequency into a "zeroeth frequency".

5. The digital television receiver of claim 1, wherein the matched filter unit comprises:
   a first matched filter configured to filter a real signal included in the first complex signal; and
   a second matched filter configured to filter an imaginary signal included in the first complex signal,
   wherein each of the first matched filter and the second matched filter is a root raised-cosign type matched filter having a roll-off factor of 0.1152.

6. The digital television receiver of claim 1, further comprising a symbol timing recovery circuit configured to estimate the predetermined symbol timing offset in response to the third complex signal and to generate the first control signal based on a result of the estimation.

7. The digital television receiver of claim 1, further comprising a carrier recovery circuit configured to estimate the predetermined carrier offset in response to the third complex signal and to generate the second control signal based on a result of the estimation.

8. The digital television receiver of claim 1, further comprising:
   a first variable amplifier configured to control the gain of a real signal included in a complex signal output from the DC remover, in response to a third control signal;
   a second variable amplifier configured to control the gain of an imaginary signal included in the complex signal output from the DC remover, in response to the third control signal; and
   a digital automatic gain control circuit configured to generate the third control signal based on the gain-controlled real signal output from the first variable amplifier and the gain-controlled imaginary signal output from the second variable amplifier.

9. The digital television receiver of claim 8, wherein the digital automatic gain control circuit comprises:
   a first magnitude calculation circuit configured to calculate the magnitude of the real signal output from the first variable amplifier;
   a second magnitude calculation circuit configured to calculate a magnitude of the imaginary signal output from the second variable amplifier;
   a first adder configured to sum an output signal of the first magnitude calculation circuit and an output signal of the second magnitude calculation circuit;
   a subtractor configured to detect a difference between an output signal of the first adder and a reference signal;
   a first amplifier having a first step size, configured to receive a signal output from the subtractor, and to control a convergence speed of the received signal;
   an accumulator configured to detect gain information based on a signal output from the first amplifier;
   a second adder configured to sum a signal output from the accumulator and a predetermined gain; and
   a first delay circuit configured to generate the third control signal by delaying an output signal of the second adder by a first delay time.

10. The digital television receiver of claim 9, wherein the accumulator comprises:
    a third adder;
    a second delay circuit configured to delay an output signal of the third adder by a second delay time; and
    a second amplifier having a second step size and configured to amplify an output signal of the second delay circuit,
    wherein the third adder sums the output signal of the first amplifier and an output signal of the second amplifier and outputs a result of the addition to the second adder and to the second delay circuit.

11. The digital television receiver of claim 9, wherein the predetermined gain input to the second adder is "1".

12. A digital television receiver comprising:
    an interpolator configured to generate a second IF signal by resampling a first intermediate frequency (IF) signal, sampled at a first sampling frequency, at a second sampling frequency and simultaneously compensating for a predetermined symbol timing offset in response to a first control signal;

a first frequency converter configured to generate a first complex signal by down converting the second IF signal and simultaneously compensating for a predetermined carrier offset in response to a second control signal;

a filter configured to generate a second complex signal by receiving the first complex signal and removing an image signal and an adjacent interference signal from the first complex signal;

a second frequency converter configured to generate a third complex signal having a double side band characteristic using the second complex signal output from the filter; and a DC remover configured to remove a pilot signal from a DC signal included in the third complex signal output from the second frequency converter.

13. The digital television receiver of claim 12, wherein the filter comprises:

a first filter configured to remove the image signal and the adjacent interference signal from a real signal included in the first complex signal;

a first matched filter configured to filter a signal output from the first filter;

a second filter configured to remove the image signal and the adjacent interference signal from an imaginary signal included in the first complex signal; and a second matched filter configured to filter a signal output from the second filter.

14. The digital television receiver of claim 13, wherein each of the first filter and the second filter is a low pass digital surface acoustic wave (SAW) filter.

15. The digital television receiver of claim 14, wherein the bandwidth of the low pass digital SAW filter is 5.38 MHz.

16. The digital television receiver of claim 13, wherein each of the first filter and the second filter is a finite impulse response filter.

17. The digital television receiver of claim 12, further comprising a symbol timing recovery circuit configured to estimate the predetermined symbol timing offset in response to the third complex signal and to generate the first control signal based on a result of the estimation.

18. The digital television receiver of claim 12, further comprising a carrier recovery circuit configured to estimate the predetermined carrier offset in response to the third complex signal and to generate the second control signal based on a result of the estimation.

19. The digital television receiver of claim 12, further comprising:

a first variable amplifier configured to control the gain of a real signal included in a complex signal, output from the DC remover, in response to a third control signal;

a second variable amplifier configured to control the gain of an imaginary signal included in the complex signal output from the DC remover, in response to the third control signal; and a digital automatic gain control circuit configured to generate the third control signal based on a real signal output from the first variable amplifier and upon an imaginary signal output from the second amplifier.

20. The digital television receiver of claim 19, wherein the digital automatic gain control circuit comprises:

a first magnitude calculation circuit configured to calculate the magnitude of the real signal output from the first amplifier;

a second magnitude calculation circuit configured to calculate the magnitude of the imaginary signal output from the second amplifier;

a first adder configured to sum an output signal of the first magnitude calculation circuit and an output signal of the second magnitude calculation circuit;

a subtractor configured to detect a difference between an output signal of the first adder and a reference signal;

a first amplifier having a first step size, configured to receive a signal output from the subtractor, and configured to control a convergence speed of the received signal;

an accumulator configured to detect gain information based on a signal output from the first amplifier;

a second adder configured to sum a signal output from the accumulator and a predetermined gain; and a first delay circuit configured to generate the third control signal by delay an output signal of the second adder by a first delay time.

21. The digital television receiver of claim 20, wherein the accumulator comprises:

a third adder;

a second delay circuit configured to delay an output signal of the third adder by a second delay time; and a second amplifier having a second step size and configured to amplify an output signal of the second delay circuit, and the third adder sums the output signal of the first amplifier and an output signal of the second amplifier and outputs a result of the addition to the second adder and the second delay circuit.

22. The digital television receiver of claim 20, wherein the predetermined gain input to the second adder is "1".

* * * * *